US009268899B2

(12) United States Patent
Tran et al.

(10) Patent No.: US 9,268,899 B2
(45) Date of Patent: Feb. 23, 2016

(54) TRANSISTOR DESIGN FOR USE IN ADVANCED NANOMETER FLASH MEMORY DEVICES

(71) Applicants: Hieu Van Tran, San Jose, CA (US); Hung Quoc Nguyen, Fremont, CA (US); Anh Ly, San Jose, CA (US); Thuan Vu, San Jose, CA (US)

(72) Inventors: Hieu Van Tran, San Jose, CA (US); Hung Quoc Nguyen, Fremont, CA (US); Anh Ly, San Jose, CA (US); Thuan Vu, San Jose, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

(21) Appl. No.: 13/830,267

(22) Filed: Mar. 14, 2013

(65) Prior Publication Data

US 2014/0282348 A1    Sep. 18, 2014

(51) Int. Cl.
| | |
|---|---|
| G06F 17/50 | (2006.01) |
| G11C 11/16 | (2006.01) |
| G11C 13/00 | (2006.01) |
| G11C 16/28 | (2006.01) |

(52) U.S. Cl.
CPC ........ *G06F 17/5081* (2013.01); *G11C 11/1673* (2013.01); *G11C 13/004* (2013.01); *G11C 16/28* (2013.01)

(58) Field of Classification Search
CPC .... G11C 16/0483; G11C 16/10; G11C 16/24; G11C 11/30; G11C 16/0466; G11C 16/08; G11C 5/025; G11C 8/10; G11C 11/1673; G11C 13/004; G11C 16/28; G06F 17/5081
USPC ............. 716/10–102, 136–139; 365/120–130
See application file for complete search history.

(56) References Cited

U.S. PATENT DOCUMENTS

| | | | |
|---|---|---|---|
| 6,822,906 | B2 | 11/2004 | Confalonieri |
| 8,686,512 | B2 | 4/2014 | Moroz et al. |
| 2003/0156458 | A1 | 8/2003 | Confalonieri |
| 2004/0047214 | A1* | 3/2004 | Jeong et al. ................... 365/202 |
| 2006/0227615 | A1 | 10/2006 | Honda |
| 2007/0091671 | A1 | 4/2007 | Ooishi et al. |
| 2007/0280021 | A1 | 12/2007 | Ueda et al. |
| 2008/0170045 | A1 | 7/2008 | Aizawa |
| 2011/0286262 | A1* | 11/2011 | Kitayama ..................... 365/149 |
| 2011/0309453 | A1 | 12/2011 | Moroz et al. |
| 2012/0294093 | A1* | 11/2012 | Yang ........................ 365/185.22 |

OTHER PUBLICATIONS

Drennan, et al, "Implications of Proximity Effects for Analog Design," 8 pages, IEEE 2006 Custom Integrated Circuits Conference (CICC).
PCT Search Report and Written Opinion dated Apr. 23, 2014 corresponding to the related PCT Patent Application No. US14/011698.
Taiwanese Office Action dated Sep. 11, 2015 corresponding to the related Taiwanese Patent Application No. 103102681.

* cited by examiner

*Primary Examiner* — Binh Tat
(74) *Attorney, Agent, or Firm* — DLA Piper LLP (US)

(57) ABSTRACT

Improved PMOS and NMOS transistor designs for sensing circuitry use in advanced nanometer flash memory devices are disclosed.

19 Claims, 7 Drawing Sheets

TRANSISTOR DESIGN FOR USE IN ADVANCED NANOMETER FLASH MEMORY DEVICES

TECHNICAL FIELD

Improved PMOS and NMOS transistor designs for use in advanced nanometer flash memory devices are disclosed.

BACKGROUND OF THE INVENTION

It is known in the prior art that analog circuits can be adversely affected by layout characteristics in the nanometer technology. For example, some known proximity effects include well proximity, Shallow Trench Isolation (STI) stress, poly gate position effect, source/drain dimensional effect, channel length modulation, and narrow width effect. These impact of these proximity effects become greater as process technologies become smaller.

Various prior art solutions have been suggested to reduce these proximity effects in an analog circuit design. However, what is needed are analog circuit design techniques that take advantage of these proximity effects and use them to enhance the operation of analog circuit specifically for memory sensing circuitry. A split gate flash memory operation and various circuitry are described in U.S. Pat. No. 7,990,773, "Sub Volt Flash Memory System," by Hieu Van Tran, et al, and U.S. Pat. No. 8,072,815, "Array of Non-Volatile Memory Cells Including Embedded Local and Global Reference Cells and Systems," by Hieu Van Tran, et al, which are incorporated herein by reference.

SUMMARY OF THE INVENTION

The aforementioned proximity and STI effects are used to enhance the design of an analog circuit for memory sensing through various embodiments.

DETAILED DESCRIPTION OF THE PREFERRED EMBODIMENTS

Figure 1A:
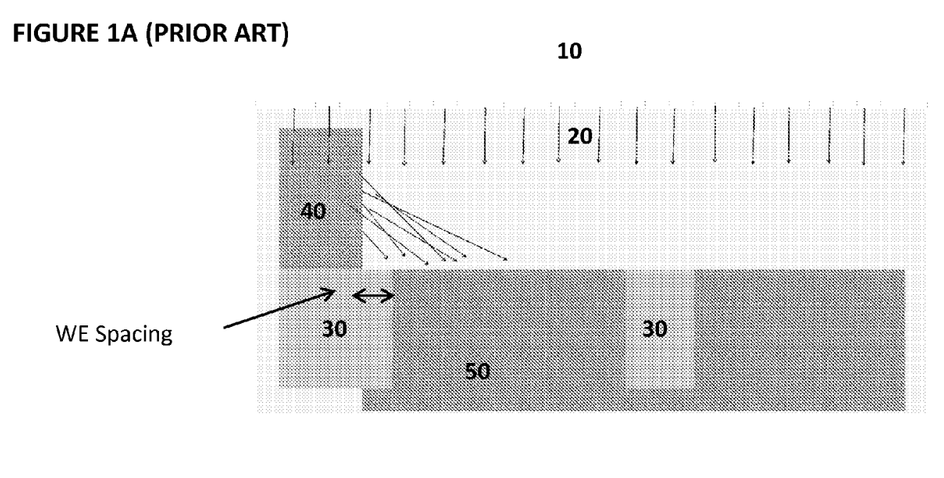
FIG. 1a depicts a prior art ion implantation process.

FIG. 1A depicts a prior art well implant process 10. STI areas 30 previously were created in semiconductor material 50, typically by etching a pattern of trenches in the silicon, depositing dielectric material in the trenches, and removing any excess dielectric. During the implant process 10 (well implant), ions are accelerated and implanted into the semiconductor material 50. Photoresist material 40 is placed on the border of the areas of interest to prevent ions 20 from implanting in neighboring areas. For illustration purposes, only one example of photoresist material 40 is shown in FIG. 1A. The well proximity effect arises from the movement of ions 20 in relation to the photoresist material 40. Specifically, ions 20 will scatter at a greater density in the areas closest to the photoresist material 40, as illustrated in FIG. 1A. The distance between the edge of photoresist material 40 and the edge of an STI area 30 can be referred to as "WE spacing," as shown in FIG. 1A.

Figure 1B:
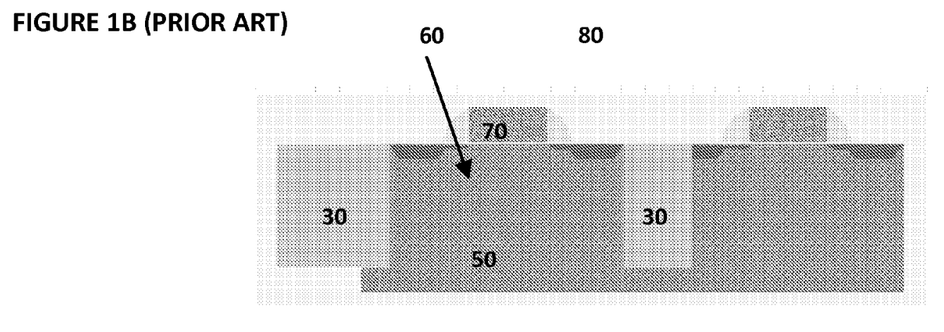
FIG. 1b depicts the result of a prior art ion implementation process.

FIG. 1B depicts the finished product 80 after the well implant process 10. As can be seen, greater implantation has occurred in the areas 60 closest to the STI areas 30 next to photoresist 40. Also shown is control gate 70. This non-uniformity in ion implantation across the channel will result in a non-uniformity of Vt (threshold voltage) across the channel. The threshold voltage is the gate voltage where an inversion layer forms to enable the flow of electrons through the gate-source junction. Thus, because of the well proximity effect, a different Vt exists across the channel below the control gate 70. Vt is higher closer to the well edge and lower further from the well edge.

Id (drain current) also will vary across the channel as a result of the well proximity effect. For a given gate voltage, the Id will be lower closer to the well edge and higher further from the well edge. Idsat (drain saturation current) will be lower closer to the well edge and higher further from the well edge.

The STI stress effect also impact the electrical performance of a channel. In general, the STI compressive stress effect is considered good for NMOS transistors but bad for PMOS transistors (STI compressive stress running across the channel as in FIG. 1B).

The term "LOD" can be used to refer to the distance between the edge of a gate and an STI edge. The term "STI width" can be used to refer to the width of an STI area.

In a PMOS transistor, Idsat will be lower for a small LOD and higher for a large LOD. Idsat will be lower for a small STI width and higher for a large STI width.

In an NMOS transistor, Idsat will be higher for a small LOD and lower for a large LOD. Idsat also will be higher for a small STI width and lower for a large STI width.

With these concepts in mind, four device types can be defined according to Table 1:

TABLE 1

| Device Label | Device Type | STI Width | LOD | WE Spacing to Source | WE Spacing to Drain |
| --- | --- | --- | --- | --- | --- |
| N-LDE1 | NMOS | small | large | large | large |
| P-LDE1 | PMOS | large | small | large | large |
| N-LDE2 | NMOS | small | large | large | small |
| P-LDE2 | PMOS | large | small | large | small |

In one embodiment, a small STI width can be 0.2-0.3 μm, and a large STI width can be 1.9-2 μm. A small LOD can be 0.6-1 μm, and a large LOD can be 2-4 μm. A small WE spacing can be 0.5-0.6 μm, and a large WE spacing can be 1-2 μm. The foregoing "small" numbers are the minimum numbers allowed by current manufacturing techniques. It is anticipated that the minimum numbers will decrease as manufacturing techniques continue to improve.

The foregoing numbers are exemplary only, and what matters is the relative sizes of small and large for each metric.

For device N-LDE1, Vts (Vt near the source) will be relatively small, Vtd (Vt near the drain) will be relatively small, and Idsat will be relatively large.

For P-LDE1, Vts will be relatively small, Vtd will be relatively small, and Idsat will be relatively large.

For N-LDE2, Vts will be relatively small, Vtd will be relatively large, and Idsat will be lower than for NMOS N-LDE1.

For P-LDE2, Vts will be relatively small, Vtd will be relatively large, and Idsat will be lower than for PMOS P-LDE1.

With these devices now defined, the characteristics of each one can be used as an advantage in analog circuit design for the flash memory sensing circuitry.

Figure 2:
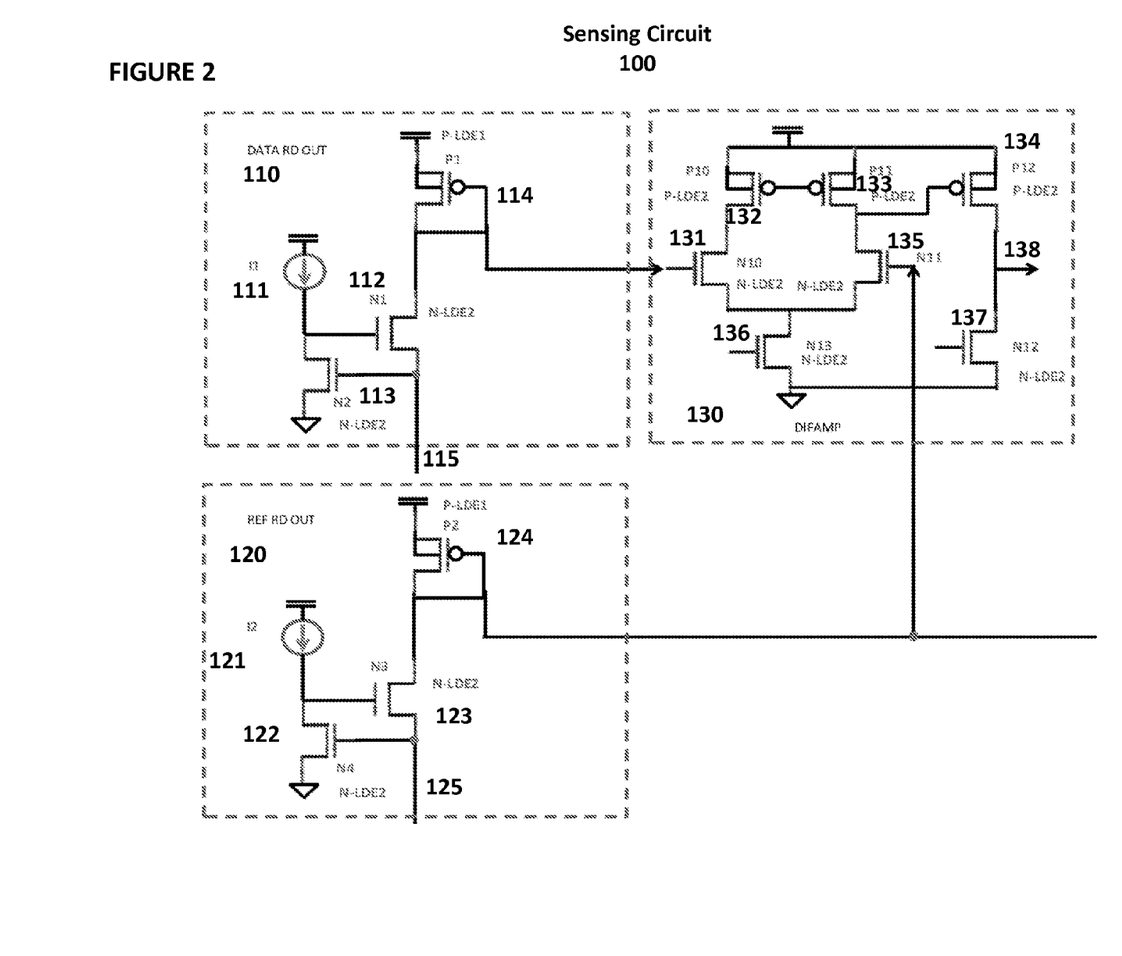
FIG. 2 depicts an embodiment of a sensing circuit.

With reference to FIG. 2, a sensing circuit 100 is depicted. Sensing circuit 100 comprises memory data read block 110, memory reference read block 120, and differential amplifier block 130. Data read block 110 comprises current source 111, cascoding sensing NMOS transistor 112 of type N-LDE2, bitline clamp NMOS transistor 113 of type N-LDE2, and diode connected sensing load PMOS transistor 114 of type P-LDE1. Memory reference read block 120 comprises current source 121, reference bitline clamp NMOS transistor 122 of type N-LDE2, cascoding sensing NMOS transistor 123 of type N-LDE2, and diode connected sensing load PMOS transistor 124 of type P-LDE1. Differential amplifier block 130 comprises input differential pair NMOS transistor 131 and 135 of type N-LDE2, current mirror load PMOS transistor 132 and 133 of type P-LDE2, output PMOS transistor 134 of type P-LDE2, current bias NMOS transistor 136 of type N-LDE2, output current bias NMOS transistor 137 of type N-LDE2, and output 138. Node 115 is coupled to the selected memory cell (not shown) to be read, and node 125 is coupled to the reference memory cell (not shown) to be used to determine the value of the selected memory cell. Differential amplifier block 130 is used to compare the signals received from data read block 110 and reference read block 120 to generate output 138 which indicates the value of the data stored in the selected memory cell. These components are connected to one another as shown in FIG. 2. Cascoding, input differential pair, current mirror, and output transistors uses type N-LDE2 for low voltage overhead and high gain. Alternatively the transistors 112,123 can be of type N-LDE1.

Figure 3:
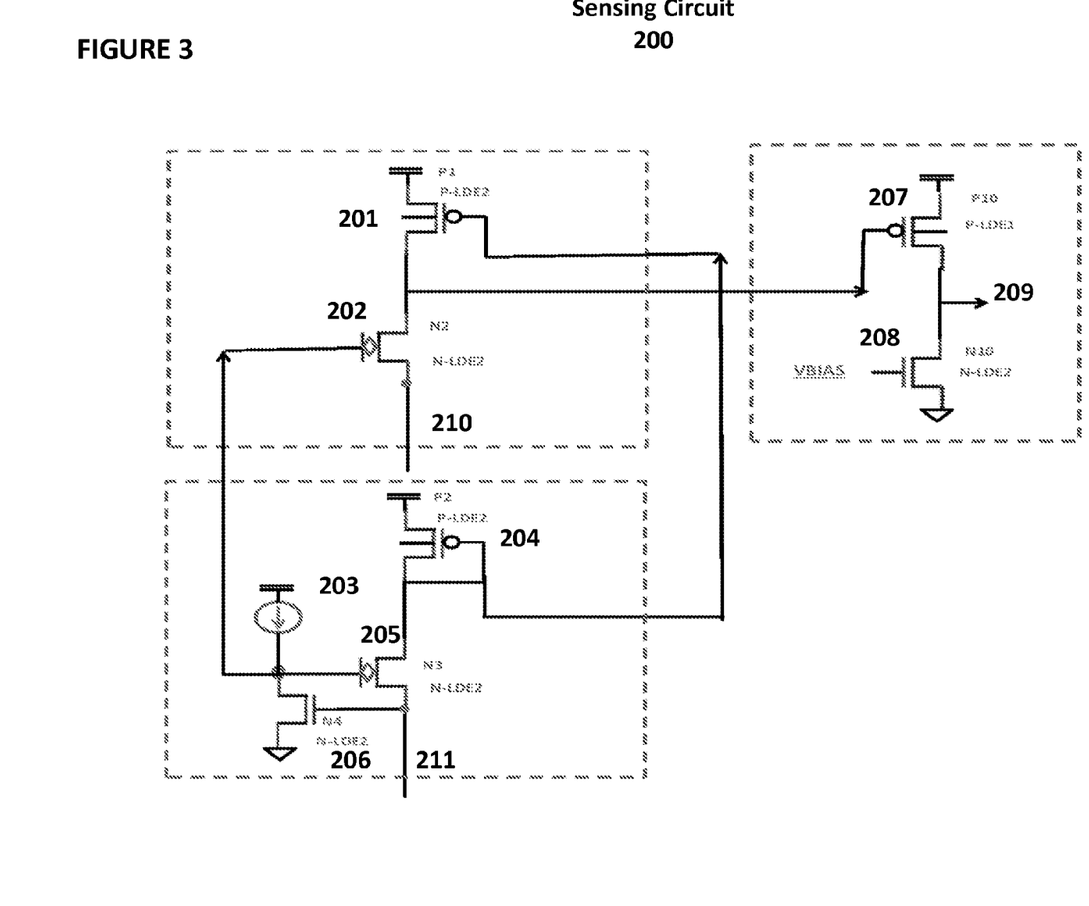
FIG. 3 depicts another embodiment of a sensing circuit.

With reference to FIG. 3, a sensing circuit 200 is depicted. Sensing circuit 200 comprises current mirror PMOS transistor 201 of type P-LDE2, cascoding NMOS transistor 202 of type N-LED2, current source 203, diode connected reference current bias PMOS transistor 204 of type P-LDE2, cascoding NMOS transistor 205 of type N-LDE2, reference bitline clamp NMOS transistor 206 of type N-LDE2, output PMOS transistor 207 of type P-LDE1, current bias NMOS transistor 208 of type N-LDE2, and output 209. Transistors 207, 208 constitutes a single ended amplifier for the output. Node 210 is coupled to the selected memory cell (not shown) to be read, and node 211 is coupled to the reference memory cell (not shown) to be used to determine the value of the selected memory cell. These components are connected to one another as shown in FIG. 3.

In this sensing circuit 200, the bitline voltage on the data memory cell (node 210) is determined by the reference bitline clamp voltage (gate of the transistor 205). The sensed output node (gate of the transistor 207) is resulting from direct sensing (comparison) of the reference current (mirrored by the transistor 201 from the reference current bias transistor 204) and the data memory cell (coupled through the node 210). Alternatively, the transistors 201,204 can be of type P-LDE1 and the transistors 202,205 can be of type N-LDE1.

Figure 4:
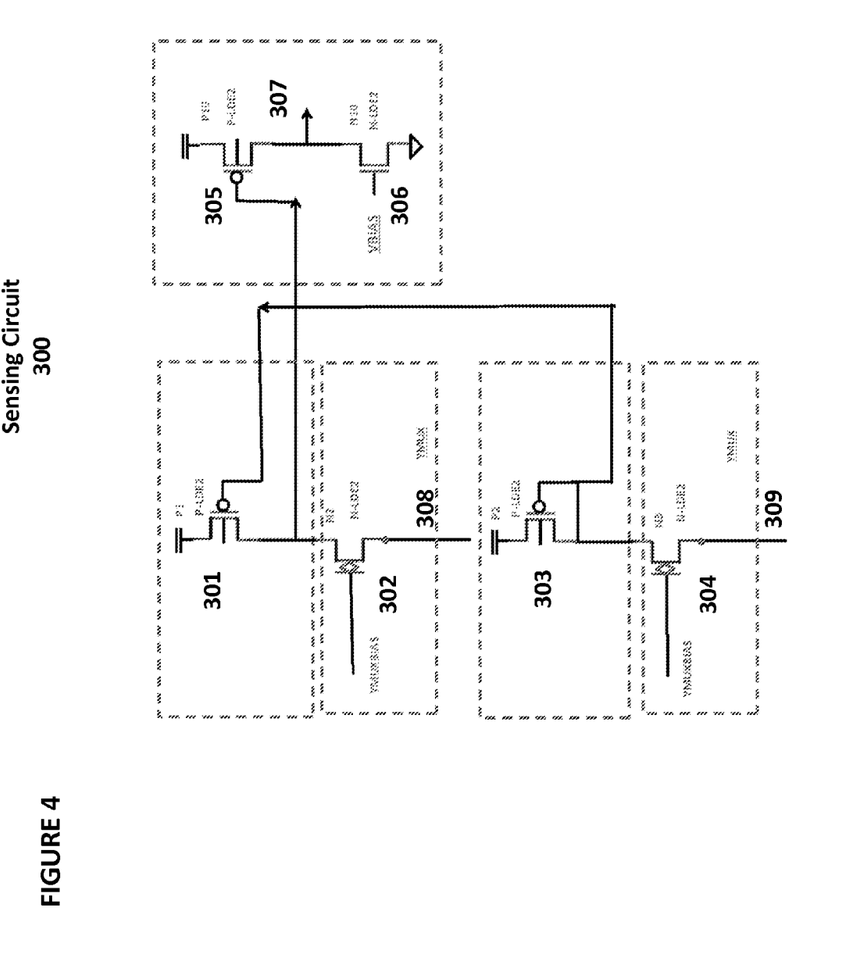
FIG. 4 depicts another embodiment of a sensing circuit.

With reference to FIG. 4, a sensing circuit 300 is depicted. Sensing circuit 300 comprises current mirror PMOS transistor 301 of type P-LDE2, cascoding NMOS transistor 302 of type N-LDE2, diode connected reference current bias PMOS transistor 303 of type P-LDE2, cascoding NMOS transistor 304 of type N-LDE2, output PMOS transistor 305 of type P-LDE2, current bias NMOS transistor 306 of type N-LDE2, and output 307. Output PMOS transistor 305 and current bias NMOS transistor 306 together constitute a single ended amplifier for the output. Node 308 is coupled to the selected memory cell (not shown) to be read, and node 309 is coupled to the reference memory cell (not shown) to be used to determine the value of the selected memory cell. These components are connected to one another as shown in FIG. 4. Cascoding NMOS transistor 302 and cascading NMOS transistor 304 are column decoder (ymux) circuitry with gates biased by a bias voltage to determine the bitline voltage in read (approximately Vblrd=~gate bias of transistors 302 or 304 minus its threshold voltage Vt). This scheme is called shared bitline bias scheme, Alternatively, the transistors 301 and 303 can be of type P-LDE1 and the transistors 302 and 304 can be of type N-LDE1.

Figure 5:
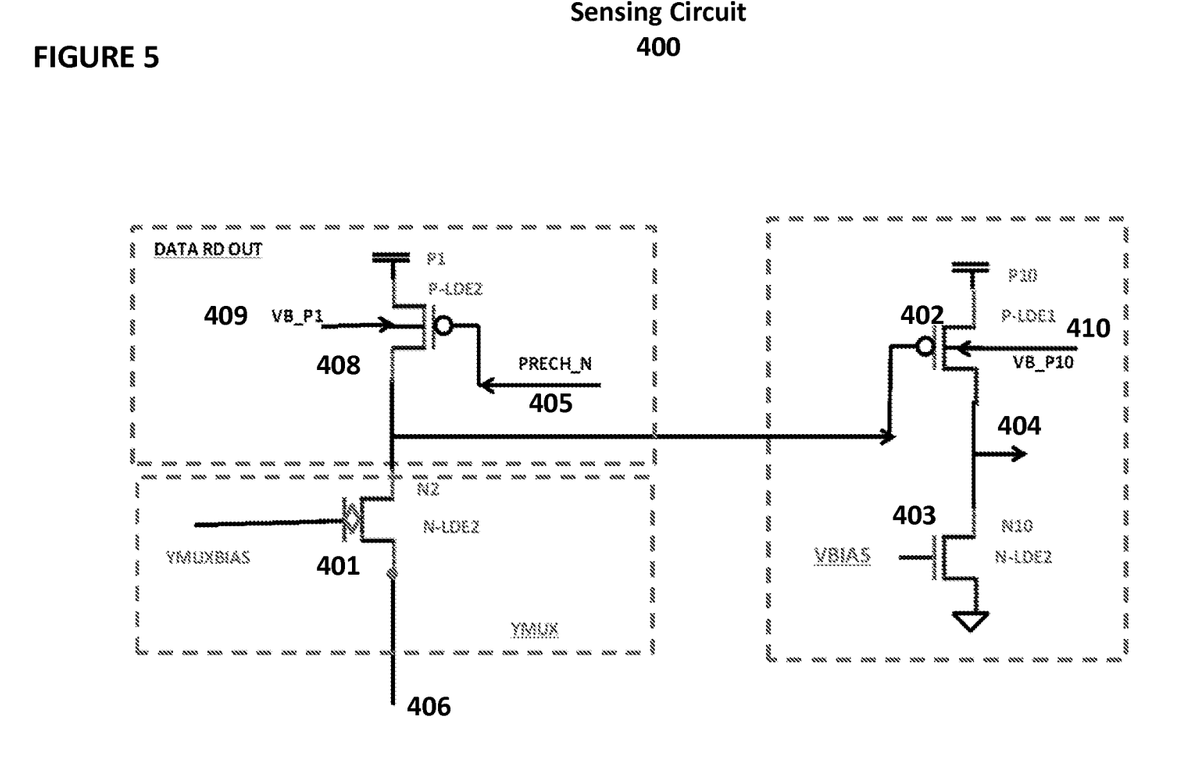
FIG. 5 depicts another embodiment of a sensing circuit.

With reference to FIG. 5, a sensing circuit 400 is depicted. Sensing circuit 400 comprises PMOS transistor 408 of type P-LDE2, cascoding NMOS transistor 401 of type N-LDE2, output PMOS transistor 402 of type P-LDE1, current bias NMOS transistor 403 of type N-LDE2, and output 404. Node 406 is coupled to the selected memory cell (not shown) to be read. Unlike the embodiments of FIGS. 2-4, a reference cell is not required in this embodiment. The gate of transistor 408 receives pre-charge node voltage 405, which in this example can be 1.2 V or gnd. The transistors 402,403 constitutes single ended amplifier for the output. These components are connected to one another as shown in FIG. 5. The sensed node (gate of the transistor 402) is precharged to a bias level through the transistor 408 by the pre-charge node voltage 405 being gnd. Then the pre-charge node voltage 405 going to a voltage level to release (weakly biased or turn off) the transistor 408. Depending on the state of the memory cell coupled to the node 406, if there is a current (e.g., erase state of the split gate cell described in U.S. Pat. No. 8,072,815) the sensed node will go down which turns on the transistor 402 to make the output 404 going high. If there is no current (e.g., programmed state of the split gate cell described in U.S. Pat. No. 8,072,815) the sensed node will stay at high which turns off the transistor 402 to make the output 404 going low. This scheme is called reference-less sensing.

The 409 bulk (nwell) substrate terminal of the PMOS transistor 408 and the 410 bulk (nwell) terminal of the PMOS transistor 402 are further forward biased (Vsource voltage–bulk voltage=small positive, e.g. 0.4v, less than Vp/n forward junction of ~0.6v) to enhance the threshold voltage (lowered) and high Idsat for lower voltage headroom and higher speed. This bulk techniques could be applied for other figures. Alternatively the transistors 408,401 can be of type P-LDE1 and N-LDE1 respectively.

Figure 6:
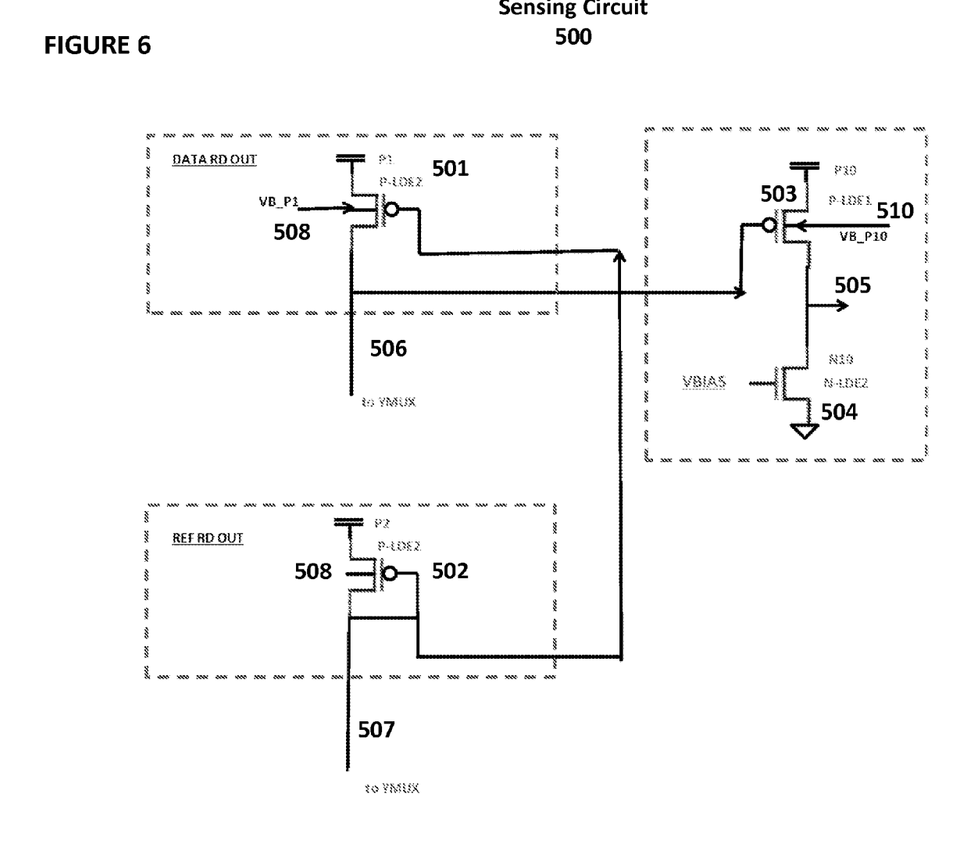
FIG. 6 depicts another embodiment of a sensing circuit.

With reference to FIG. 6, a sensing circuit 500 is depicted. Sensing circuit 500 comprises current mirror load PMOS transistor 501 of type P-LDE2, diode connected reference current bias PMOS transistor 502 of type P-LDE2.output PMOS transistor 503 of type P-LDE1, current bias NMOS transistor 504 of type N-LDE2, and output 505. Node 506 is coupled to the selected memory cell (not shown) to be read, and node 507 is coupled to the reference memory cell (not shown) to be used to determine the value of the selected memory cell. The bulk substrate of PMOS transistor 501 receives bias voltage 508, and the substrate of PMOS transistor 502 receives bias voltage 508, and the substrate of PMOS transistor 503 receives bias voltage 510. The bulk substrate biases are forward biased by a small amount to lower threshold voltages to enhance performance. The transistor 503,504 constitutes single ended amplifier for the output These components are connected to one another as shown in FIG. 6. Alternatively the transistors 501,502 can be of type P-LDE1.

Figure 7:
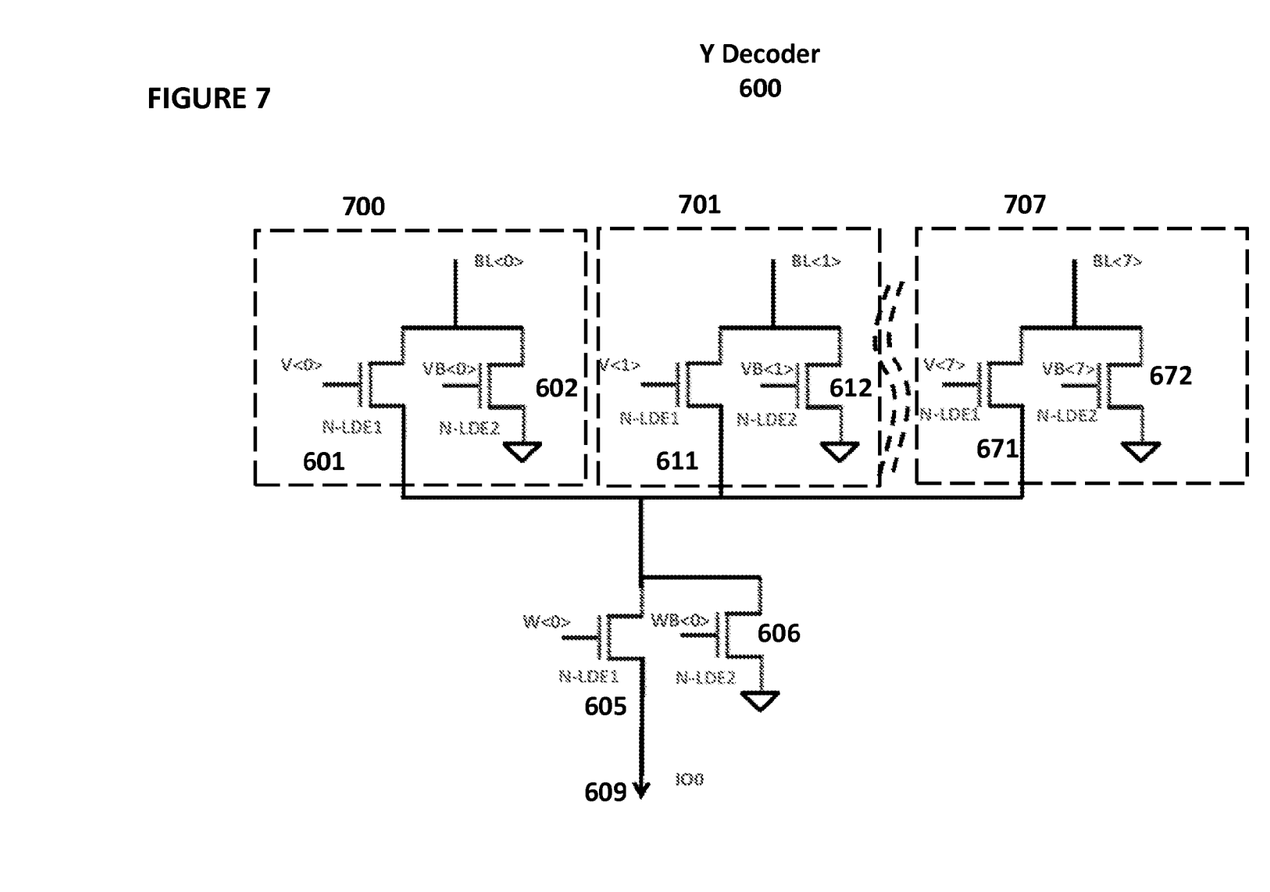
FIG. 7 depicts an embodiment of a Y decoder.

With reference to FIG. 7, a Y decoder 600 is depicted. Y decoder 600 comprises block 700 for receiving bit 0 of a bit line (not shown), block 701 for receiving bit 1 of the bit line, and block 707 for receiving bit 7 of the bit line. It is to be understood that identical blocks also can be used for receiving bits 2 through 6, or for receiving bits above bit 7 (for example, if there is a 16-bit bit line). Block 700 comprises NMOS transistor 601 of type N-LDE1 and NMOS transistor 602 of type N-LDE2. Block 701 comprises NMOS transistor 611 of type N-LDE1 and NMOS transistor 612 of type N-LDE2. Block 708 comprises NMOS transistor 671 of type N-LDE1 and NMOS transistor 672 of type N-LDE2. Y decoder 600 further comprises NMOS transistor 605 of type N-LDE1, NMOS transistor 606 of type N-LDE2, and output 609. Y decoder 600 can be used as a bit line decoder to read data from a flash memory array (not shown). These components are connected to one another as shown in FIG. 7.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A sensing circuit for use in a memory device, comprising:
   a first circuit block coupled to a selected memory cell, wherein the first circuit block comprises a P-LDE1 transistor and one or more N-LDE2 transistors;
   a second circuit block coupled to a reference memory cell, wherein the second circuit block comprises a P-LDE1 transistor and one or more N-LDE2 transistors;
   a third circuit block coupled to the first circuit block and second circuit block to generate an output indicating the data stored in the selected memory cell, wherein the third circuit block comprises a plurality of P-LDE2 transistors and a plurality of N-LDE2 transistors.

2. The sensing circuit of claim 1, wherein the first circuit block further comprises a current source.

3. The sensing circuit of claim 2, wherein the second circuit block further comprises a current source.

4. The sensing circuit of claim 1, wherein each P-LDE1 transistor was manufactured with a well spacing of 1-2 μm to its drain.

5. The sensing circuit of claim 4, wherein each P-LDE1 transistor was manufactured with a well spacing of 1-2 μm to its source.

6. The sensing circuit of claim 1, wherein each P-LDE1 transistor comprises a gate whose edge is 0.6-1.0 μm away from the edge of the nearest shall trench isolation (STI) area.

7. The sensing circuit of claim 6, wherein each P-LDE1 transistor comprises an STI area of width 1.9-2.0 μm.

8. The sensing circuit of claim 1, wherein each N-LDE2 transistor was manufactured with a well spacing of be 0.5-0.6 μm to its drain.

9. The sensing circuit of claim 8, wherein each N-LDE-2 transistor was manufactured with a well spacing of 1-2 μm to its source.

10. The sensing circuit of claim 1, wherein each N-LDE2 transistor comprises a gate whose edge is 2-4 μm away from the edge of the nearest shall trench isolation (STI) area.

11. The sensing circuit of claim 10, wherein each N-LDE2 transistor comprises an STI area of width 0.2-0.3 μm.

12. A sensing circuit for use in a memory device, comprising:
   a first circuit block coupled to a selected memory cell, wherein the first circuit block comprises a P-LDE2 transistor;
   a second circuit block coupled to a reference memory cell and to the first circuit block, wherein the second circuit block comprises a P-LDE2 transistor;
   a third circuit block coupled to the first circuit block to generate an output indicating the data stored in the selected memory cell, wherein the third circuit block comprises a P-LDE1 transistor and an N-LDE2 transistor.

13. The sensing circuit of claim 12, wherein each P-LDE2 transistor was manufactured with a well spacing of be 0.5-0.6 μm to its drain.

14. The sensing circuit of claim 13, wherein each P-LDE-2 transistor was manufactured with a well spacing of 1-2 μm to its source.

15. The sensing circuit of claim 12, wherein each P-LDE2 transistor comprises a gate whose edge is 0.6-1.0 μm away from the edge of the nearest shall trench isolation (STI) area.

16. The sensing circuit of claim 15, wherein each P-LDE2 transistor comprises an STI area of width 1.9-2.0 μm.

17. A sensing circuit for use in a memory device, comprising:
   a first circuit block coupled to a selected memory cell, wherein the first circuit block comprises a cascoding N-LDE1 transistor and a load P-LDE1 transistor;
   a second circuit block coupled to a reference memory cell, wherein the second circuit block comprises cascoding N-LDE1 transistor and a load P-LDE1 transistor;
   a third circuit block coupled to the first circuit block and second circuit block to generate an output indicating the data stored in the selected memory cell, wherein the third circuit block comprises an N-LDE2 transistor and an P-LDE2 transistor.

18. The sensing circuit of claim 17, wherein the first circuit block further comprises a current source.

19. The sensing circuit of claim 17, wherein the second circuit block further comprises a current source.

* * * * *